(12) United States Patent
Jiang et al.

(10) Patent No.: US 10,734,572 B2
(45) Date of Patent: Aug. 4, 2020

(54) DEVICE WITH CAPPING LAYER FOR IMPROVED RESIDUE DEFECT AND METHOD OF PRODUCTION THEREOF

(71) Applicant: GLOBALFOUNDRIES Singapore Pte. Ltd., Singapore (SG)

(72) Inventors: Yi Jiang, Singapore (SG); Curtis Chun-I Hsieh, Singapore (SG); Wanbing Yi, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 20 days.

(21) Appl. No.: 16/038,897

(22) Filed: Jul. 18, 2018

(65) Prior Publication Data
US 2020/0028067 A1    Jan. 23, 2020

(51) Int. Cl.
| | | |
|---|---|---|
| H01L 43/02 | (2006.01) | |
| H01L 23/532 | (2006.01) | |
| H01L 43/12 | (2006.01) | |
| H01L 27/22 | (2006.01) | |

(52) U.S. Cl.
CPC ........ *H01L 43/02* (2013.01); *H01L 23/53295* (2013.01); *H01L 27/222* (2013.01); *H01L 43/12* (2013.01)

(58) Field of Classification Search
CPC ......... H01L 43/12; H01L 43/08; H01L 43/02; H01L 27/228; H01L 27/222
USPC ............................... 438/3; 257/421, E21.665
See application file for complete search history.

(56) References Cited

U.S. PATENT DOCUMENTS

| | | | |
|---|---|---|---|
| 2011/0156181 A1* | 6/2011 | Takeuchi | B82Y 10/00 257/421 |
| 2012/0032287 A1* | 2/2012 | Li | H01L 43/08 257/421 |
| 2013/0119494 A1* | 5/2013 | Li | H01L 43/08 257/421 |
| 2015/0171314 A1 | 6/2015 | Li et al. | |
| 2015/0311251 A1* | 10/2015 | Yi | H01L 27/222 257/421 |
| 2016/0268336 A1 | 9/2016 | Shum et al. | |
| 2017/0084820 A1* | 3/2017 | Tan | H01L 43/08 |
| 2017/0092693 A1* | 3/2017 | Tan | H01L 27/228 |

* cited by examiner

*Primary Examiner* — Jonathan Han
(74) *Attorney, Agent, or Firm* — Ditthavong & Steiner P.C.

(57) ABSTRACT

A device including a capping layer over a portion of a top electrode, and method of production thereof. Embodiments include an MRAM cell in a first region and a logic area in a second region of a substrate, wherein the MRAM cell includes a MTJ pillar between a top electrode and a bottom electrode; and a capping layer over a portion of the top electrode.

19 Claims, 8 Drawing Sheets

DEVICE WITH CAPPING LAYER FOR IMPROVED RESIDUE DEFECT AND METHOD OF PRODUCTION THEREOF

TECHNICAL FIELD

The present disclosure relates to semiconductor devices, including integrated circuits (ICs). The present disclosure is particularly applicable to magnetic random access memory (MRAM) structures in 28 nanometer (nm), 22 nm technology node and beyond.

BACKGROUND

The process of etching MRAM cell for array connection is challenging because of the possibility of over-etching (OE) tantalum (Ta) in the top electrode of the magnetic tunnel junction (MTJ), thereby outgassing the Ta residue defect and impacting device performance during electrical testing (ET).

A need therefore exists for a device with a capping layer to achieve a balanced etch for both MRAM array and logic area to solve the Ta residue defect for a cleaner ET, and for enabling methodology.

SUMMARY

An aspect of the present disclosure is a device including a capping layer over a portion of the top electrode.

Another aspect of the present disclosure is a method of forming a capping layer over a portion of the top electrode.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a MRAM cell in a first region and a logic area in a second region of a substrate, wherein the MRAM cell includes a MTJ pillar between a top electrode and a bottom electrode; and a capping layer over a portion of the top electrode.

Another aspect of the present disclosure is a method including forming a MRAM cell in a first region and a logic area in a second region of a substrate, wherein the MRAM cell includes a MTJ pillar between a top electrode and a bottom electrode; and forming a capping layer over a portion of the top electrode.

A further aspect of the present disclosure is a device including: a MRAM cell in a first region and a logic area in a second region of a substrate, wherein the MRAM cell includes a MTJ pillar between a top electrode and a bottom electrode; and a capping layer including silicon nitride (SiN) and formed to a thickness of 30 nm to 50 nm over a portion of the top electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of OE of the top electrode resulting in Ta residue defect attendant upon performing RIE for array connection. The problem is solved, inter alia, by forming a capping layer over a portion of the top electrode.

Embodiments in accordance with the present disclosure include a device with a MRAM cell in a first region and a logic area in a second region of a substrate, wherein the MRAM cell includes a MTJ pillar between a top electrode and a bottom electrode; and a capping layer over a portion of the top electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
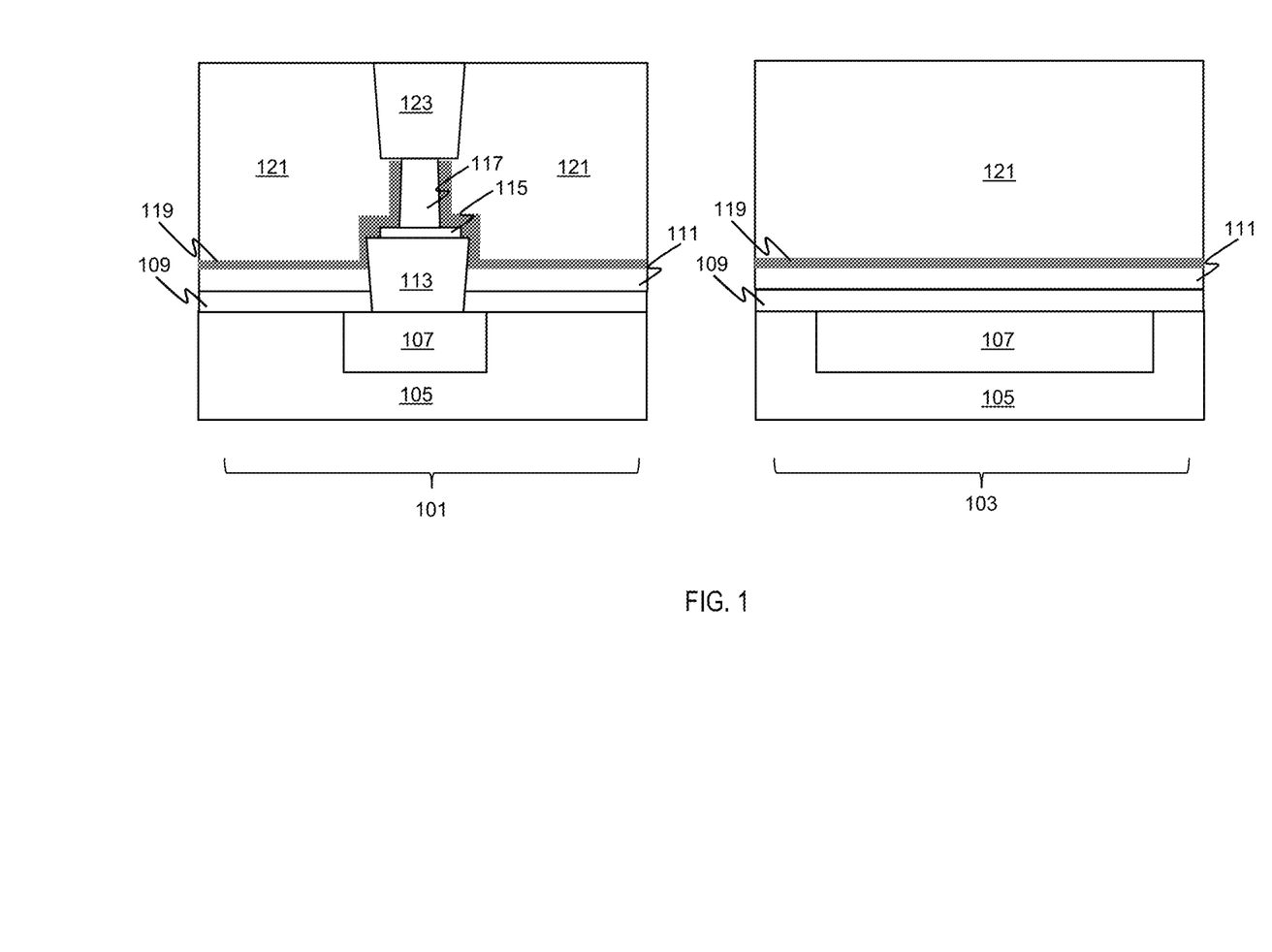
FIGS. 1 through 8 schematically illustrate cross-sectional views of a process flow for forming a capping layer over a portion of the top electrode, in accordance with an exemplary embodiment.

FIGS. 1 through 8 schematically illustrate cross-sectional views of a process flow for forming a capping layer over a portion of the top electrode, in accordance with an exemplary embodiment. Referring to FIG. 1, a substrate (not shown for illustrative convenience) having MRAM cell in region 101 and logic area in region 103 is provided. Thereafter, a low-K dielectric layer 105 is formed, e.g., of hydrogenated oxidized silicon carbon (SiCOH) dielectric film or a similar interlayer dielectric (ILD) material having a K value of about 2.7, over regions 101 and 103 by chemical vapor deposition (CVD). Then, an interconnect layer 107 is formed, e.g., of ultra low-K dielectric materials having a K value of about 2.5, to a thickness, e.g., of about 74 nm to about 100 nm and a width of about 39 nm to about 51 nm, in the low-K dielectric layer 105. Next, an Nblok layer 109 is formed, e.g., to a thickness of about 22 nm to 28 nm, over the interconnect layer 107 and the low-K dielectric layer 105. Subsequently, a low-K dielectric layer 111 is formed, e.g., of SiCOH dielectric film or a similar ILD material having a K value of about 2.7, over the Nblok layer 109 by CVD. Then, a portion of the low-K dielectric layer 111 and the Nblok layer 109 in region 101 is removed, e.g., by a conventional etching process, forming a trench (not shown for illustrative convenience). Subsequently, the trench is filled with conducting materials, e.g., tantalum nitride (TaN) or any other material with similar functional properties, forming a bottom electrode 113 that is in contact with the interconnect layer 107. In this instance, the bottom electrode 113 is formed to a thickness, e.g., of about 65 nm to about 95 nm, and to a width, e.g., of about 80 nm to about 100 nm.

Thereafter, an MTJ film 115 is formed, e.g., of cobalt (Co), iron (Fe), boron (B), magnesium oxide (MgO) or any other material with similar functional properties, to a thickness, e.g., of about 20 nm to about 40 nm, over a portion of the bottom electrode 113. Next, an MTJ pillar 117 is formed, e.g., of a TaN capping layer or any other material with similar functional properties, to a thickness, e.g., of about 20 nm to about 40 nm, and a width, e.g., of about 50 nm to about 75 nm, over a portion of the MTJ film 115. Then, a SiN liner 119 is formed, e.g., to a thickness of 20 nm to 30 nm, on the sidewalls of the MTJ pillar 117 and over the MTJ film 115, the bottom electrode 113 and the low-K dielectric layer 111. Subsequently, a low-K dielectric layer 121 is formed, e.g., of SiCOH dielectric film or a similar ILD material having a K value of about 2.7, over the SiN liner 119 and the MTJ pillar 117 by CVD. Thereafter, a portion of the low-K dielectric layer 121 in region 101 is removed, e.g., by a conventional etching process, thereby exposing an upper surface of the MTJ pillar 117 and forming a trench (not shown for illustrative convenience). The trench is then filled with conducting material, e.g., TaN or any other material with similar functional properties, forming a top electrode 123 that is in contact with the MTJ pillar 117. Subsequently, the top electrode 123 is planarized by chemical mechanical planarization (CMP), thus the upper surface of the top electrode 123 is substantially coplanar to the upper surface of the low-k dielectric layer 121.

Figure 2:
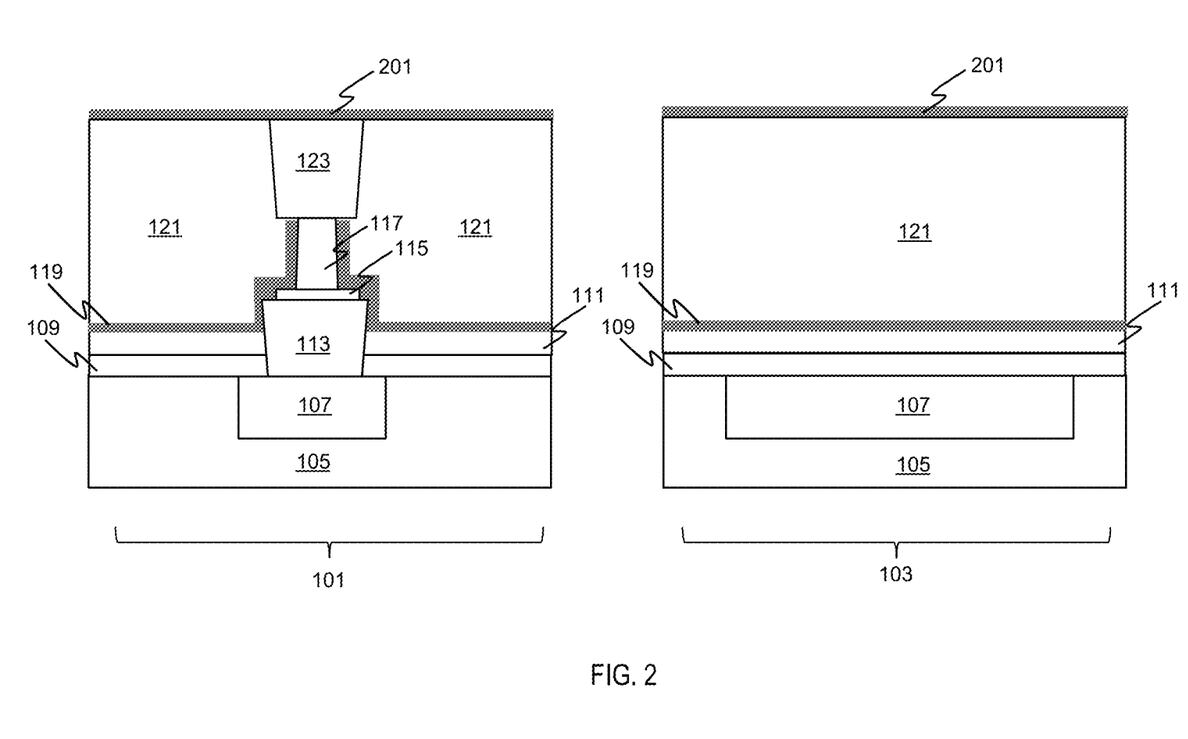
Figure 3:
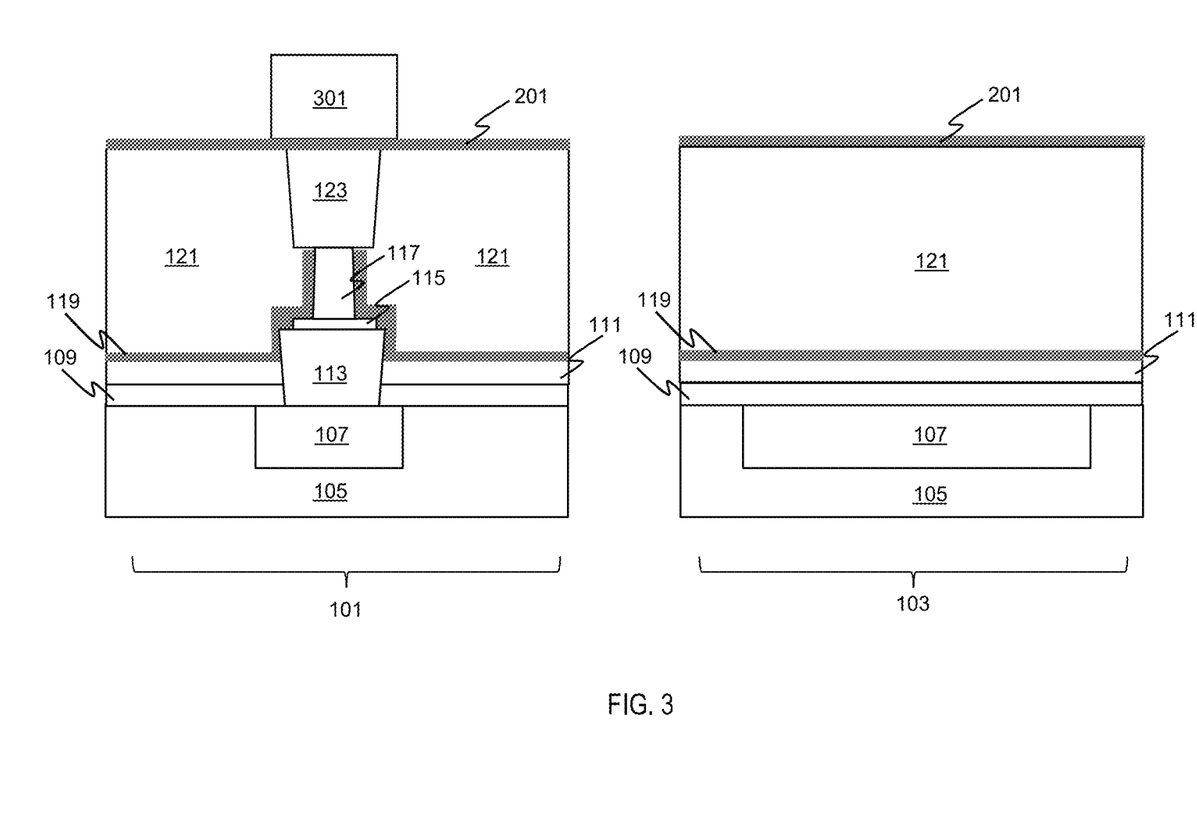
Figure 4:
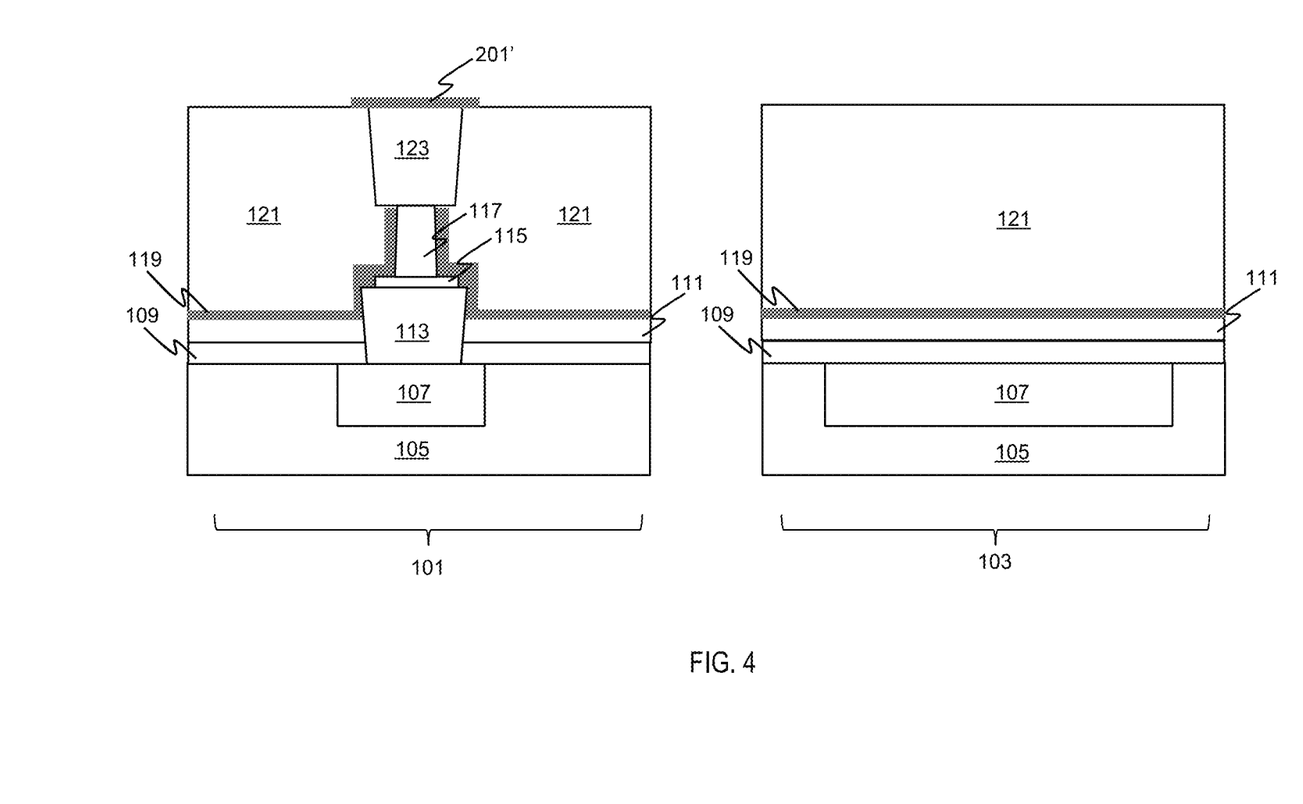

As shown in FIG. 2, a capping layer 201 is conformally formed, e.g., of SiN or any other material with similar functional properties, over the low-k dielectric layer 121 and the top electrode 123 to a thickness, e.g., of about 30 nm to about 50 nm. Next, a photoresist 301 is formed, e.g., a negative photoresist including TaN or any other material with similar functional properties, over a portion of the capping layer 201 in region 101, as illustrated in FIG. 3. Subsequently, the exposed portion of the capping layer 201 is removed, e.g., by reactive-ion etching (RIE) or other similar etching processes, in regions 101 and 103, forming capping layer 201' in region 101, as represented in FIG. 4. Thereafter, the photoresist 301 is removed, e.g., by stripping or other similar etching processes.

Figure 5:
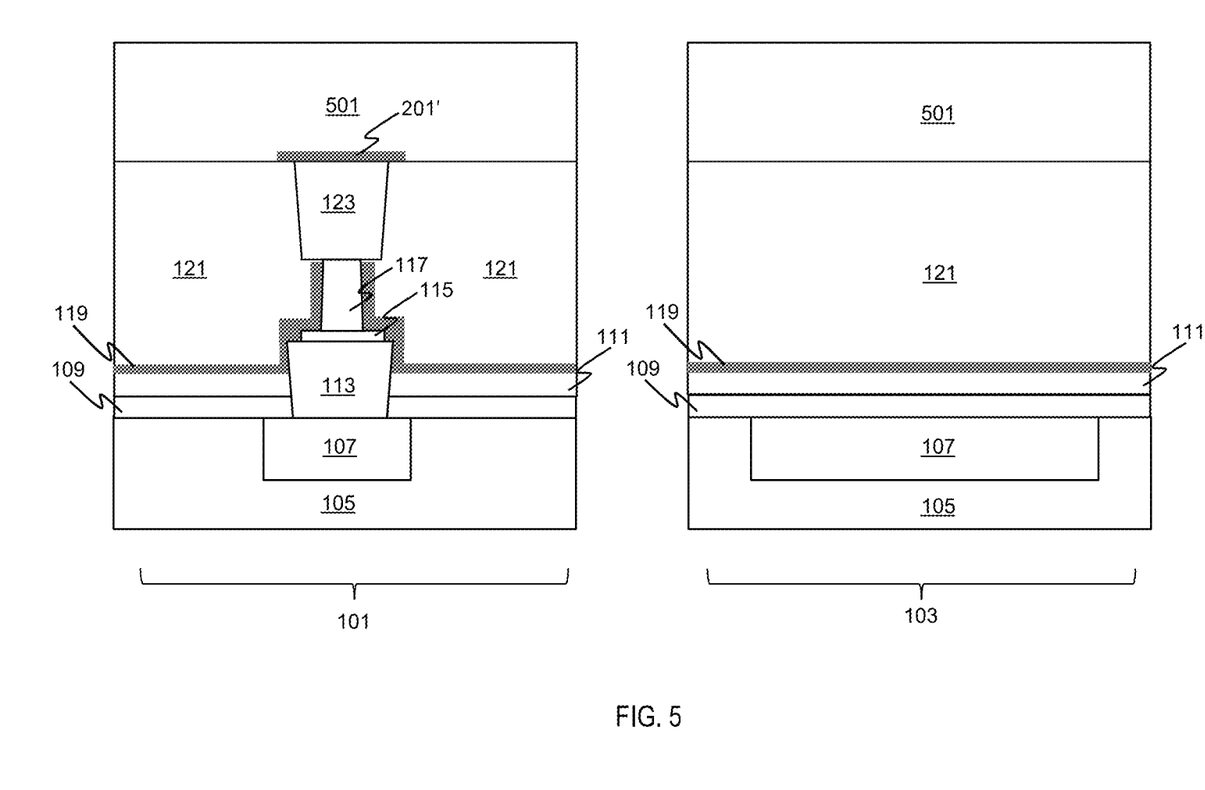
Figure 6:
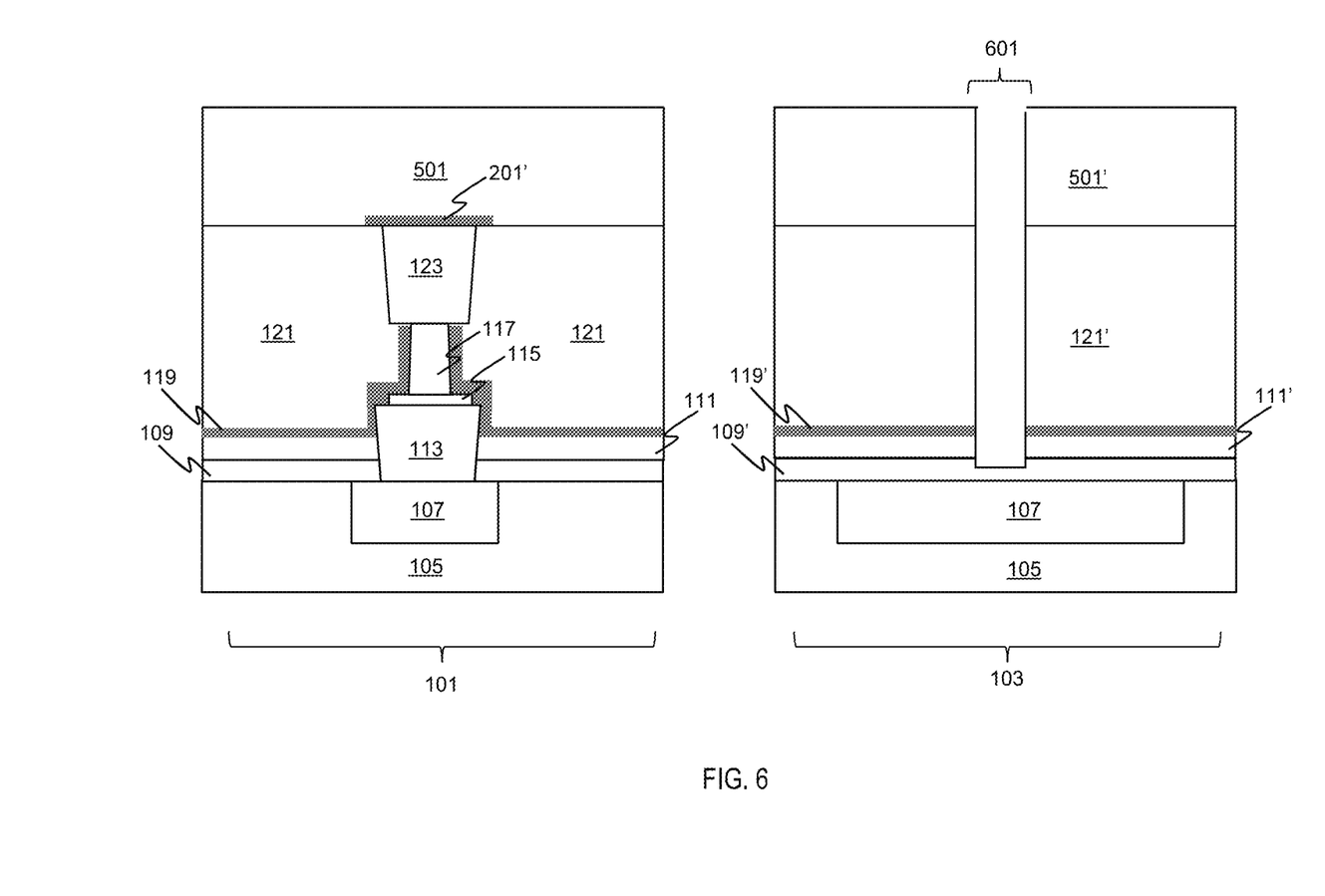
Figure 7:
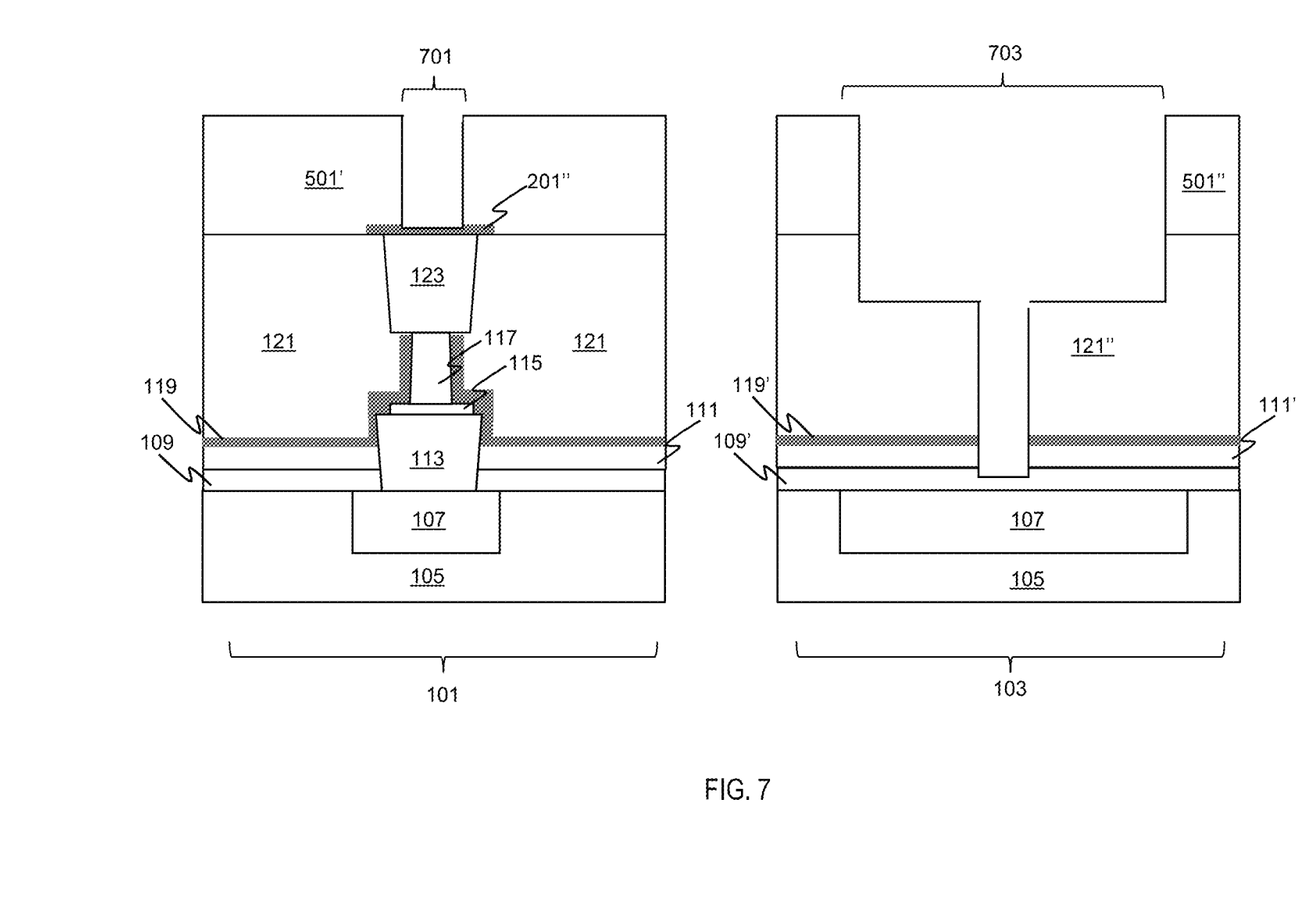
Figure 8:
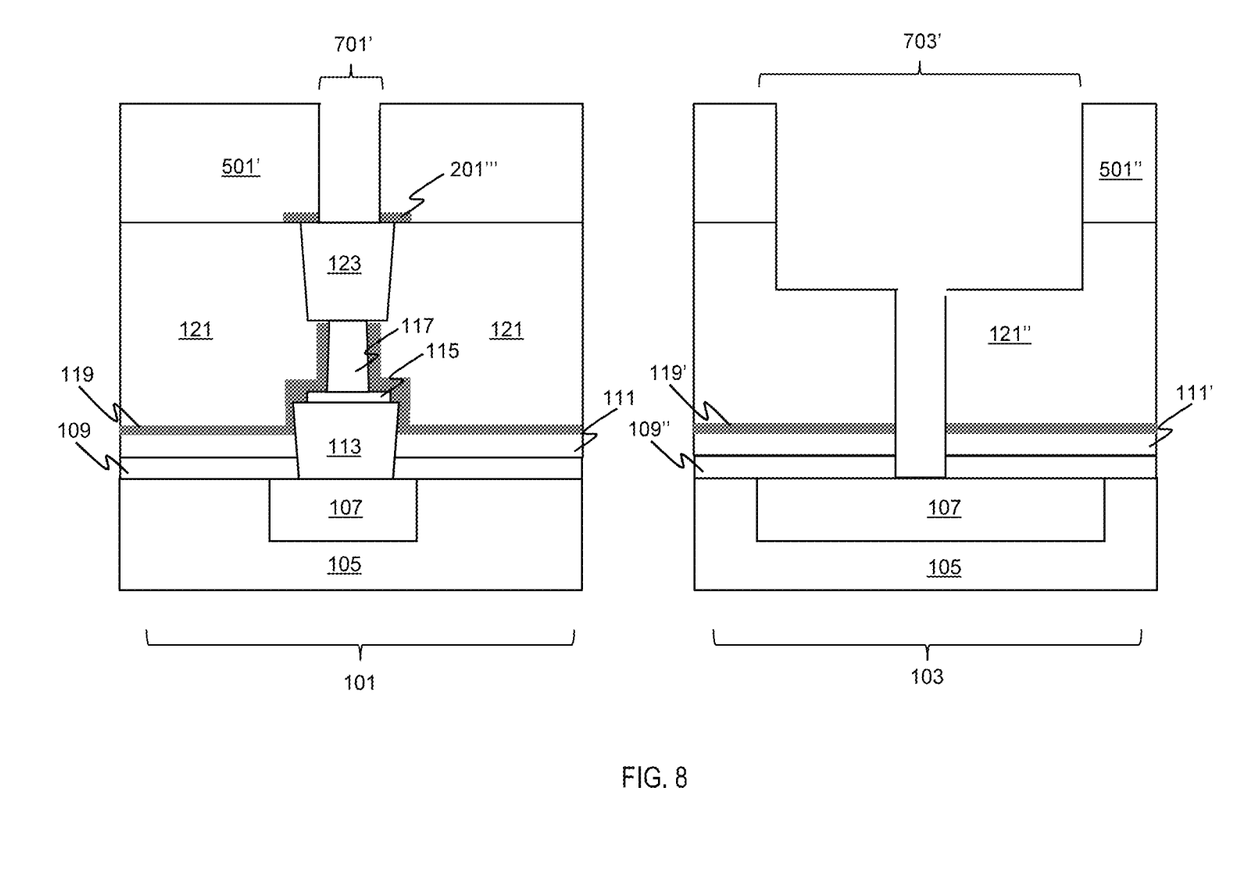

Referring to FIG. 5, a low-K dielectric layer 501 is formed, e.g., of SiCOH dielectric film or a similar ILD material having a K value of about 2.7, over the capping layer 201' and the low-k dielectric layer 121. As depicted in FIG. 6, a portion of the low-k dielectric layers 501 and 121, the SiN liner 119, the low-K dielectric layer 111 and the Nblok layer 109 in region 103 is removed, e.g., by dry etching or other similar etching processes, thereby forming low-K dielectric layers 501' and 121', SiN liner 119', low-k dielectric layer 111', Nblok layer 109' and a trench 601. As shown in FIG. 7, a portion of low-k dielectric layer 501 and capping layer 201' in region 101 is removed, e.g., by RIE or other similar etching processes, forming low-k dielectric layer 501', capping layer 201" and a trench 701. Simultaneously, a portion of low-k dielectric layers 501' and 121' in region 103 are further removed, e.g., by RIE or other similar etching processes, forming low-k dielectric layer 501" and 121" and a trench and via profile 703. Thereafter, as shown in FIG. 8, capping layer 201" is further etched, e.g., by RIE or other similar etching processes, through trench 701 to create an opening, e.g., having a width of about 90 nm to about 120 nm, and exposing a portion of an upper surface of top electrode 123, and forming capping layer 201''' and trench 701'. Simultaneously, Nblok layer 109' is further etched, e.g., by RIE or other similar etching processes, through trench 703 to create an opening, e.g., having a width of about 80 nm to about 3000 nm, and exposing a portion of an upper surface of interconnect layer 107, and forming Nblok layer 109" and trench 703'.

The embodiments of the present disclosure can achieve several technical effects, such as a balanced RIE etch for both array and logic area to solve Ta residue defects, an improved ET outlier and electromigration (EM) performance, and prevention of Ta sputter-out. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAMs, spin-transfer-torque (STT) MRAM, particularly in the 28 nm, 22 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
a magnetic random access memory (MRAM) cell in a first region and a logic area in a second region of a substrate, wherein the MRAM cell comprises a magnetic tunnel junction (MTJ) pillar between a top electrode and a bottom electrode;
an MTJ film over a portion of the bottom electrode;
a capping layer over a portion of the top electrode; and
a silicon nitride (SiN) liner on upper and side surfaces of the bottom electrode and on upper and side surfaces of the MTJ film.
2. The device according to claim 1, further comprising:
a first low-k dielectric layer over the first region and the second region of the substrate;
an interconnect layer in the first low-k dielectric layer;
an Nblok layer over the interconnect layer and the first low-k dielectric layer; and
a second low-k dielectric layer over the Nblok layer.
3. The device according to claim 2, further comprising:
the bottom electrode through the second low-k dielectric layer and the Nblok layer in the first region contacting the interconnect layer; and
the MTJ pillar over a portion of the MTJ film.

4. The device according to claim 3, further comprising:
the SiN liner on sidewalls of the MTJ pillar and over the MTJ film and the second low-k dielectric layer; and
a third low-k dielectric layer over the SiN liner and the MTJ pillar.

5. The device according to claim 4, further comprising:
the top electrode through the third low-k dielectric layer in the first region contacting the MTJ pillar, upper surface of the top electrode substantially coplanar to upper surface of the third low-k dielectric layer.

6. The device according to claim 4, further comprising:
a fourth low-k dielectric layer over the third low-k dielectric layer and the capping layer in the first region, and over a portion of the third low-k dielectric layer in the second region, a trench to the top electrode in the first region and a T-shaped trench to the interconnect layer in the second region formed, respectively.

7. The device according to claim 2, wherein the top electrode and the bottom electrode comprise tantalum nitride (TaN).

8. The device according to claim 1, wherein the capping layer comprises silicon nitride (SiN).

9. The device according to claim 1, wherein the capping layer is formed to a thickness of 30 nanometer (nm) to 50 nm.

10. A method comprising:
forming a magnetic random access memory (MRAM) cell in a first region and a logic area in a second region of a substrate, wherein the MRAM cell comprises a magnetic tunnel junction (MTJ) pillar between a top electrode and a bottom electrode;
forming an MTJ film over a portion of the bottom electrode;
forming a capping layer over a portion of the top electrode; and
forming a silicon nitride (SiN) liner on upper and side surfaces of the bottom electrode and on upper and side surfaces of the MTJ film.

11. The method according to claim 10, further comprising:
forming a first low-k dielectric layer over the first region and the second region of the substrate;
forming an interconnect layer in the first low-k dielectric layer;
forming an Nblok layer over the interconnect layer and the first low-k dielectric layer; and
forming a second low-k dielectric layer over the Nblok layer.

12. The method according to claim 11, further comprising:
forming the bottom electrode through the second low-k dielectric layer and the Nblok layer in the first region contacting the interconnect layer; and
forming an MTJ pillar over a portion of the MTJ film.

13. The method according to claim 12, further comprising:
forming the SiN liner on sidewalls of the MTJ pillar and over the MTJ film and the second low-k dielectric layer;
forming a third low-k dielectric layer over the SiN liner and the MTJ pillar; and
forming the top electrode through the third low-k dielectric layer in the first region contacting the MTJ pillar.

14. The method according to claim 13, comprising forming the capping layer by a method including:
conformally forming a silicon nitride (SiN) layer over the third low-k dielectric layer and the top electrode;
forming a photoresist over a portion of the SiN layer in the first region;
removing exposed SiN layer in the first region and the second region;
removing the photoresist;
forming a fourth low-k dielectric layer over the SiN layer and the third low-k dielectric layer;
removing a portion of the fourth low-k dielectric layer, the third low-k dielectric layer, the SiN liner, the second low-k dielectric layer and the Nblok layer in the second region exposing upper surface of the interconnect layer; and
removing a portion of the fourth low-k dielectric layer and the capping layer in the first region exposing upper surface of the top electrode.

15. The method according to claim 13, comprising forming the top electrode by a method including:
removing a portion of the third low-k dielectric layer exposing upper surface of the MTJ pillar, forming a trench;
filling the trench with conducting material contacting the MTJ pillar, wherein the conducting materials comprises tantalum nitride (TaN); and
planarizing by chemical mechanical planarization (CMP), upper surface of the top electrode substantially coplanar to upper surface of the third low-k dielectric layer.

16. The method according to claim 12, comprising forming the bottom electrode by a method including:
removing a portion of the second low-k dielectric layer and the Nblok layer, forming a trench; and
filling the trench with conducting materials contacting the interconnect layer, wherein the conducting materials comprises tantalum nitride (TaN).

17. A device comprising:
a magnetic random access memory (MRAM) cell in a first region and a logic area in a second region of a substrate, wherein the MRAM cell comprises a magnetic tunnel junction (MTJ) pillar between a top electrode and a bottom electrode;
an MTJ film over a portion of the bottom electrode;
a capping layer comprising silicon nitride (SiN) and formed to a thickness of 30 nanometer (nm) to 50 nm over a portion of the top electrode; and
a silicon nitride (SiN) liner on upper and side surfaces of the bottom electrode and on upper and side surfaces of the MTJ film.

18. The device according to claim 17, further comprising:
an interconnect layer in a first low-k dielectric layer formed over the first region and the second region of the substrate;
an Nblok layer over the interconnect layer and the first low-k dielectric layer;
a second low-k dielectric layer over the Nblok layer;
the bottom electrode through the second low-k dielectric layer and the Nblok layer in the first region contacting the interconnect layer; and
the MTJ pillar over a portion of the MTJ film.

19. The device according to claim 18, further comprising:
the SiN liner on sidewalls of the MTJ pillar and over the MTJ film and the second low-k dielectric layer;
a third low-k dielectric layer over the SiN liner and the MTJ pillar;
the top electrode through the third low-k dielectric layer in the first region contacting the MTJ pillar; and
a fourth low-k dielectric layer over the third low-k dielectric layer and the capping layer in the first region, and over a portion of the third low-k dielectric layer in the second region, a trench to the top electrode and a t-shaped trench to the interconnect layer formed, respectively.

* * * * *